United States Patent [19]
Witt

[11] Patent Number: 5,421,974
[45] Date of Patent: Jun. 6, 1995

[54] INTEGRATED CIRCUIT HAVING SILICIDE-NITRIDE BASED MULTI-LAYER METALLIZATION

[75] Inventor: Kevin L. Witt, Austin, Tex.

[73] Assignee: Advanced Micro Devices, Inc., Sunnyvale, Calif.

[21] Appl. No.: 41,817

[22] Filed: Apr. 1, 1993

[51] Int. Cl.$^6$ ............................................. C23C 14/34
[52] U.S. Cl. ............................ 204/192.25; 204/192.3; 437/192
[58] Field of Search .................... 204/192.25, 192.3; 437/192

[56] References Cited

U.S. PATENT DOCUMENTS

| | | | |
|---|---|---|---|
| 4,173,449 | 12/1992 | Lorenzen et al. | 437/192 |
| 4,927,505 | 5/1990 | Sharma | 204/192.25 |
| 5,130,267 | 7/1992 | Kaya et al. | 437/192 |

FOREIGN PATENT DOCUMENTS

| | | | |
|---|---|---|---|
| 402061 | 12/1990 | European Pat. Off. | 437/192 |
| 63-12152 | 1/1988 | Japan | 437/192 |
| 1272138 | 10/1989 | Japan | 437/192 |

OTHER PUBLICATIONS

Dirks, et al., "On The Microstructure-Property Relationship of W-Ti-(N) Diffusion Barriers," *Thin Solid Films*, 193/194 (1990) 201-210.

Alay, et al., "Quantitative Analysis of W(N), TiW and TiW(N) Matrices Using XPS, AES, RBS, EPMA and XRD," *Surface And Interface Analysis*, vol. 17, (1991) 373-382.

Oparowski, et al., "The Characterization of Thin Film Diffusion Barriers," *Microstructural Science—Proc. of the Twentieth Annual Technical Meeting of the International Metallographic Society*, vol. 16 (1988) 379-393.

Kamgar, et al., "Self-Aligned TiN Barrier Formation by Rapid Thermal Nitridation of TiSi$_2$ in Ammonia," *J. Appl. Phys.* 66(6), (Sep. 15, 1989) 2395-2401.

Hara, et al., "Formation of Titanium Nitride Layers By The Nitridation of Titanium in High-Pressure Ammonium Ambient," *Appl. Phys. Lett.* 57(16), (Oct. 15, 1990) 1660-1661.

Chittipeddi, et al., "Characterization of Rapid Thermal Annealed TiN$_x$O$_y$/TiSi$_2$ Barrier Layer," *Nat. Res. Soc. Symp. Proc.*, vol. 181, (1990) 527-530.

*Primary Examiner*—Asok Pal
*Attorney, Agent, or Firm*—Conley, Rose & Tayon

[57] ABSTRACT

An improved metallization and method of metallization manufacture is provided which achieves highly conductive interconnect routing and ohmic contact between active junctions while minimizing or inhibiting cross-diffusions between the junctions and overlying conductors. A barrier layer of titanium and tungsten alloy, formed as part of the metallization layer, is placed between the junction and overlying conductor to minimize or inhibit such diffusions. The barrier forms a silicide at the barrier/junction interface at approximately the same time or simultaneously with a nitride formed at the upper surface of the barrier. Nitridation and silicidation is formed in a conventional diffusion furnace at low pressure to ensure accurate control of silicidation, nitridation, and contamination therein. By utilizing a conventional diffusion furnace to grow the nitride and silicide, the improved methodology herein achieves more cost effective metallization.

13 Claims, 3 Drawing Sheets

INTEGRATED CIRCUIT HAVING SILICIDE-NITRIDE BASED MULTI-LAYER METALLIZATION

BACKGROUND OF THE INVENTION

1. Field of the Invention

This invention relates to an integrated circuit and more particularly to an integrated circuit metallization layer having nitride and silicide regions.

2. Background of the Relevant Art

To form an integrated circuit from a group of devices manufactured simultaneously upon the same monolithic substrate, the devices must be electrically connected to one another. The entire process of making ohmic contact to the devices and routing conducting material between ohmic contacts is defined herein as "metallization." While materials other than metal are often used, the term metallization is generic in its application and is derived from the origins of interconnect technology, where metals were the first conductors used. As the complexity of integrated circuits has increased, the complexity of the metallization composition has also increased. Accordingly, metallization may incorporate conductive materials other than metals.

It is not uncommon to have several levels of metallization spaced from each other across the upper substrate surface. In addition, each level of metallization may contain multi-layers of conductive material. As such, metallization may include one or more layers, whereby certain layers may be used in the contact region and other layers configured as interconnect routing between the contacts. Metallization thereby uses specific composition in the contact area to enhance adherence to the underlying silicon. The material used in the contact area, however, may not be suitable as a routing material. Therefore, routing may, for example, utilize a material which is more highly conductive and easier to deposit and etch than the contact area material.

The low resistivity of aluminum, excellent adherence to both silicon and silicon dioxide, and the ohmic contact it makes to silicon assures it as an attractive conductor for use in the multi-layer metallization scheme. Aluminum can be easily deposited on silicon using conventional techniques such as evaporation or sputtering. Unfortunately, with the advent of high density integrated circuits having thinner diffusion junctions, some of the other properties of aluminum have prevented its complete applicability as the sole composition of the metallization layer.

Referring to FIG. 1, modern integrated circuit manufacture often utilizes relatively thin diffusion junctions 10 placed within the upper surface of silicon or gallium arsenide substrate 12. Junction 10, contained within an active region between thick oxide areas 14, provides an ohmic contact region upon which metallization layer 16 can be deposited. If metallization 16 comprises only aluminum without other multi-layer components, then certain deleterious effects may arise when the aluminum is brought in contact with the doped silicon junction. The most important outcome of aluminum and silicon bonding is silicon's appreciable solubility into the aluminum. Aluminum's ability to dissolve thin layers of silicon or silicon dioxide helps ensure good physical contact or adherence. However, if enough silicon dissolves in the aluminum, small pits can form in the silicon surface. The pits are filled with aluminum and the phenomena, often referred to as aluminum spiking, occurs.

As aluminum fills the pits or voids left by the outdiffusing silicon, the amount of aluminum fill can extend completely through a thin junction 10 as shown by reference numeral 18. Aluminum passing completely through the junction provides a conductive path through the junction thereby rendering the device inoperable.

The formation of pits or voids within the silicon is often achieved during sintering operation. Sintering at 300° C. produces discernable pitting at depths to 0.2 $\mu$m. At 350° C., pits of 0.5 $\mu$m have been observed and at 450° C., pits of 2.0 $\mu$m may occur. In order to prevent such pitting, aluminum may be deposited saturated with silicon so that it is unable to absorb any more silicon when contacted with the substrate. Alternatively, or in addition to using saturated aluminum, a thin barrier layer may be placed between the aluminum and silicon. The barrier reduces or minimizes cross-diffusion and destructive reaction between silicon and aluminum, yet allows charge carriers to pass freely from the junction to the overlying metallization.

There are many types of barriers which may be used. A sacrificial barrier is one having a finite lifetime. A sacrificial barrier can be initially placed between the aluminum and silicon where it is eventually consumed by the formation and diffusion of intermediate compounds at the aluminum/barrier interface and the barrier/silicon interface. Sacrificial barriers are predominantly made of pure metals such as transition or refractory metals (or bi-metallic alloys). Aluminides and silicides form at the aluminum/barrier interface and barrier/silicon interface, respectively, and then diffuse outward throughout the barrier material until the initial barrier composition no longer exists. Thus, sacrificial barriers provide only a temporary fix to the problem and do not meet the stringent long-term requirements of very large scale integration (VLSI) or ultra large scale integration (ULSI) technology.

A second class of barrier, known as a diffusion barrier, provides an infinite lifetime—as opposed to the finite lifetime of a sacrificial barrier. A diffusion barrier includes a diffusion layer made of an inert material placed between the aluminum and silicon. Diffusion barriers, being inert, do not substantially react with adjacent aluminum and silicon layers. Inert material, however, offers poor adhesion to the adjacent aluminum and silicon. In order to increase adhesion, multilayers of dissimilar material are formed within the metallization embodying the barrier. A silicide is often used to aid barrier adhesion to silicon. Silicides generally have very high electrical conductivity and therefore make very dependable ohmic contacts. Silicides are formed by depositing a thin layer of refractory metals over the silicon surface, heating the surface to a high enough temperature for the silicon and metal to react in the active region, and then etch away the unreacted metal on top of the thick oxide. Subsequently, additional metallization layers are added to the exposed upper surface of the refractory barrier metal. Refractory metals often require temperatures near 600° C. for silicide formation.

Many different types of refractory metals may be used to form the barrier layer within metallization. As shown below in Table I, refractory metals such as titanium and tungsten provide very low ohmic contact resistance in the active silicon region and therefore are preferred barrier materials.

TABLE I

| Silicide | Resultant Resistivity | Sinter Temperature |
| --- | --- | --- |
| $TiSi_2$ | 13–16 $\mu\Omega/cm^2$ | 900° C. |
| $TaSi_2$ | 35–55 $\mu\Omega/cm^2$ | 1000° C. |
| $CrSi_2$ | 600 $\mu\Omega/cm^2$ | 700° C. |
| $MoSi_2$ | 100 $\mu\Omega/cm^2$ | 1000° C. |
| $WSi_2$ | 70 $\mu\Omega/cm^2$ | 1000° C. |
| $FeSi_2$ | >1000 $\mu\Omega/cm^2$ | 700° C. |
| $PtSi_2$ | 28–35 $\mu\Omega/cm^2$ | 800° C. |
| $CoSi_2$ | 18–25 $\mu\Omega/cm^2$ | 900° C. |
| $NiSi_2$ | 50–60 $\mu\Omega/cm^2$ | 900° C. |

When a blanket film of refractory metal is placed over patterned oxide silicon surface and subjected to a thermal sinter, silicide forms only where the metal is in direct contact with the silicon substrate. The unreacted metal can be removed during wet or dry etch processing leaving silicide only in the active regions or windows (such as over source and drain areas). Silicides so formed are often referred to as self-aligned silicides or salicides. The formation of silicides can increase the effective contact area to enhance device operation.

The idea of opening a contact region using normal photolithography and then placing a barrier layer of refractory metal over the upper surface of the contact window is well known. Moreover, subsequent placement of a conductive material over the barrier and across selective regions of thick oxide is also well known. The fabrication steps necessary to deposit, sinter and pattern the various layers used in multi-layer metallization can be fairly complex and difficult to incorporate in a normal process flow. Generally speaking, barrier material and overlying aluminum can be deposited using conventional sputtering techniques. The barrier, however, is generally annealed prior to placement of overlying aluminum. Without anneal, implant-induced defects within the barrier and underlying junction (or active region) may remain thereby causing inoperable or improper circuit operation. Annealing helps induce the movement of implanted ions to their proper positions within the crystallographic lattice network. Such annealing can be performed in a separate rapid thermal anneal apparatus at high temperature and at high pressure as described in Hara, T., et al., "Formation of Titanium Nitride Layers by the Nitridation of Titanium in High Pressure Ammonium Ambient," *Appl. Phys. Lett.* 57 (16), 15 Oct. 1990; and, Kamgar, A., et al., "Self-Aligned TiN Barrier Formation by Rapid Thermal Nitridation of $TiSi_2$ in Ammonia, "*J. Appl. Phys.* 66 (6), 15 Sep. 1989 (incorporated herein by reference). Both the Hara and Kamgar articles describe rapid thermal anneal (RTA) in the presence of ammonium to produce nitridation at the upper surface of the barrier during the formation of silicide at the barrier/substrate interface. The barrier is specifically described as titanium having a thickness of 900 Å to 1200 Å. Pure titanium barriers, however, do not exhibit columnar microstructure such as that present in a combination tungsten and titanium barrier. Unfortunately, tungsten and titanium films behave as rather poor diffusion barriers unless nitrogen is incorporated into the titanium and tungsten structure. As described in Dirks, A, et al,. "On the Microstructure-Property Relationship of W—Ti—(N) Diffusion Barriers," *Thin Solid Films*, 193/194 (1990) pp. 201–210, the columnar microstructure of combination titanium and tungsten readily combines with nitrogen to provide a more suitable diffusion barrier than offered by pure titanium or pure tungsten.

Barriers having titanium, tungsten and nitrogen inhibit cross diffusion better than if the barrier is pure titanium or pure tungsten. However, the methodology by which nitrogen is added to the combination barrier is often complex and cumbersome. Adding nitrogen to the barrier can fall outside the normal integrated circuit fabrication flow. Additional process or fab step can increase the cost of circuit manufacture and reduce yields. It is therefore advantageous that nitrogen be added during normal processing flow of the integrated circuit. Preferably, additional steps or equipment must be minimized in order to make titanium-tungsten barriers cost effective. It would therefore be desirable to incorporate nitrogen using the same processing equipment utilized, for example, in doping the substrate. Modification to pre-existing equipment must be eliminated or minimized. It is also important that the concentration of nitrogen be closely monitored during anneal, and that only controlled amounts of certain contaminants be allowed to enter the anneal chamber. It would therefore be desirable to utilize a low-pressure annealling chamber to ensure additional or undesirable contaminants not be allowed to enter the resulting barrier and thereby adversely affect device operation.

SUMMARY OF THE INVENTION

The problems outlined above are in large part solved by the apparatus and method of the present invention. That is, metallization layer hereof utilizes combination tungsten and titanium diffusion barrier deposited over an active region. After the barrier material is deposited, the barrier is annealed by re-inserting the substrate into the diffusion tube which was previously utilized for diffusing dopant into the active area. As such, the present invention utilizes fewer fabrication apparatuses by not requiring a separate annealer apparatus, e.g., a rapid thermal annealer.

The diffusion tube subjects the barrier to ammonia at high temperature and low pressure. Monatomic nitrogen, released by the decomposition of ammonia, is diffused into the upper exposed surface of the barrier to effect nitridation of that surface at approximately the same time as the barrier's lower surface undergoes silicidation. Accordingly, multi-layer barrier formation is achieved in a single step using a conventional diffusion tube. In addition, low pressure within the tube ensures unwanted contamination is minimized, and that only desired amounts of contaminates are allowed to enter the tube. For example, certain impurities such as oxygen, hydrogen or argon may be controlled and placed within the low-pressure diffusion tube to effectively "pack" the grain boundaries of the barrier. It is postulated that packing of grain boundaries may minimize silicon diffusion and aluminum through the barrier. Low-pressure operation allows the operator to more closely control and monitor the quantity of impurities within the tube and, subsequently, within the barrier. High pressure chambers such as those found in RTAs may allow adverse impurity fluctuation due to the sensitivity of the controlled pressure. Concentration can rapidly fluctuate in an RTA due to slight changes in pressure caused by, for example, variation in loading procedure, improper ingress of operator to the substrate or any leak within the chamber. Further, the low pressure, and subsequent low concentration of reactant, allows for a slow and controllable chemical reaction.

The result of a slower and more controllable reaction is a uniform reaction product extending across the target area. Still further, not only is low pressure operation safer, but it can be more easily obtained and maintained with existing equipment and process flow (e.g., conventional diffusion tube).

Broadly speaking, the present invention contemplates an improved integrated circuit metallization layer. The metallization layer is produced comprising the steps of providing a silicon substrate and placing the substrate into a high temperature diffusion tube containing a dopant directed across and into a select active region of the substrate. A barrier layer may be deposited across the upper surface of the active region. The barrier layer comprises titanium and tungsten material having a thickness less than 500 Å. The substrate may then be heated in the presence of ammonia to form nitride at the upper surface of the barrier simultaneous with or approximately at the same time in which silicide is formed at the interface between the barrier and the active region. A conductive layer may then be deposited across the barrier to form the complete metallization.

Depositing a barrier film includes removing the substrate from the high temperature diffusion tube and inserting the substrate into a chamber containing a target comprised of titanium and tungsten material. An inert gas such as argon can be introduced into the chamber, wherein argon ions are formed within the chamber and directed upon the target. Argon ions striking the target eject molecules of titanium and tungsten from the target allowing the molecules to collect upon the substrate.

Heating the substrate after the barrier is formed includes placing the substrate and barrier between heating coils within the diffusion tube. The coils can be preheated to a temperature level substantially equal to 600° C. The diffusion tube can then be evacuated to a first pressure level allowing nitrogen into the tube at a substantially constant flow rate. The diffusion tube can then be evacuated to a second pressure level, higher than the first pressure level, heated to a temperature substantially equal to 800° C., and then ammonia may be introduced into the diffusion tube at a substantially constant flow rate. The first pressure level is less than $5 \times 10^{-3}$ torr and the second pressure level is less than one torr. A exemplary nitrogen flow and ammonia flow is substantially equal to eight standard liters per minute (slpm) and 120 standard cubic centimeters per minute (sccm), respectively.

The present invention further contemplates sputter depositing a barrier layer less than 500 Å in thickness of titanium and tungsten material across the upper surface of the active region. The barrier comprises an upper surface exposed to an environment and a lower surface bonded to the active region. The substrate, including the active region, can be re-inserted into the heated diffusion tube. Ammonia is introduced into the diffusion tube to form nitride within the upper surface of the barrier simultaneous or approximate with the formation of silicide within the lower surface of the barrier. The nitride upper surface and silicide lower surface are spaced from each other within the barrier body such that a diffusion-blocking region exists between the nitride and silicide. A conductive layer, preferably aluminum or combination aluminum and silicon, is sputter deposited across the upper, exposed nitride surface of the barrier.

BRIEF DESCRIPTION OF THE DRAWINGS

Other objects and advantages of the invention will become apparent upon reading the following detailed description and upon reference to accompanying drawings in which.

Figure 1:
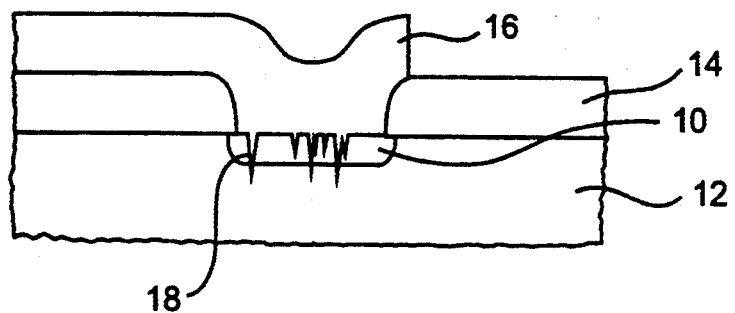
FIG. 1 is an enlarged, partial cross-section view of a failure mechanism associated with many contact areas having overlying metallization associated with a prior design.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 2:
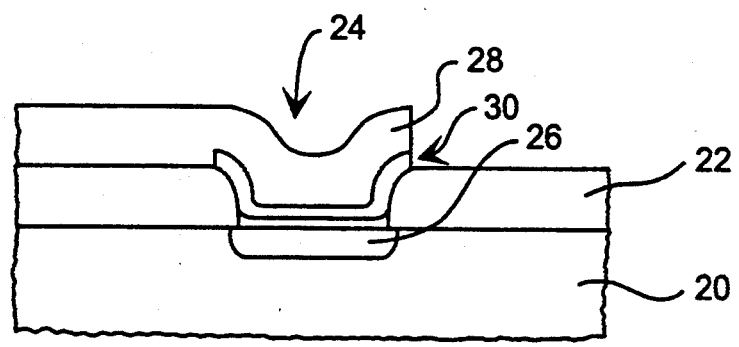
FIG. 2 is an enlarged, partial cross-section view of a contact area with overlying metallization according to the present invention.

Turning now to the drawings, FIG. 2 illustrates an enlarged, partial cross-section view of substrate 20 having relatively thick oxide layer 22 placed at select locations across the upper surface of substrate 20. As is well known in the art substrate 20 includes any crystalline material configured in the same orientation as the seed crystal. The material can be either silicon, gallium arsenide, etc. In addition, substrate 20 can be arranged in either the 111 or 100 plane and can be either n-type or p-type. The upper surface of substrate 20 can accommodate growth of oxide region 22 by various methods of oxidation including thermal oxidation, chemical vapor deposition (CVD) oxidation, chemical oxidation and/or anodic oxidation.

An active region or contact area 24 is formed by patterning a window through oxide 22 using photoresist (positive or negative resist), optical lithography, and select etch (wet or dry etch). Active region 24 allows direct dopant access from a dopant source into the upper surface of substrate 20 to form diffusion region or junction region 26. Dopant material can include any type of impurity dopant utilized in an integrated circuit including phosphorous, arsenic, boron, etc. Diffusion of dopant into junction 26 can be carried out by varying mechanisms well known in the art preferably including diffusion furnaces.

MOS circuits are characterized by shallow diffusion junctions 26. MOS transistors require only a very thin layer for the channel and any source-drain depth below the channel may only add unwanted capacitance. Thus, source/drain diffusions can be 1.0 μm or less in depth. Diffused wells in CMOS process may be somewhat thicker, but are usually only 5.0 to 6.0 μm in depth. Thus, thinner (or shallower) junctions allow less stray capacitance and provide a more dense configuration necessary for VLSI circuits.

In order to ensure that overlying metallization (including conductor 28 and barrier 30) do not completely alloy or spike through a thin junction 26, certain precautions must be taken. Specifically, barrier 30 must be deposited in active region 24 prior to overlying conductor 28 deposition. Barrier 30 comprises a material having a composition of tungsten and titanium. Barrier 30 can be sputter deposited upon the upper surface of junction 26 by conventional techniques. The amount of titanium included in the alloy of titanium and tungsten can vary from 10 to 30 atomic percent. The ratio of Ti:W can thereby vary between 10:90 to 30:70 atomic percent. That is, for every atom of titanium there exists approximately 2.33 to 9 atoms of tungsten. A typical resulting sheet resistance of barrier 30 having combination titanium and tungsten is approximately 10 Ω/sq.±2 Ω/sq.

Because tungsten and titanium can be relatively expensive, their use is often limited only within the active regions. Upper conductive layer 28 electrically contacts the upper surface of barrier 30 and is routed across oxide 22 to various other devices (not shown) within substrate 20. Conductor 28 is preferably made from a less expensive, highly conductive and easily patterned material such as, but not limited to, aluminum. Both barrier 30 and conductor 28 are deposited across the upper surface of the monolithic circuit in two separate deposition steps. Various deposition methods can be used including sputter deposition, evaporation, ion beam deposition, chemical vapor deposition (CVD) and enhanced (photon or plasma) CVD. A preferred deposition technique includes sputter deposition described below.

Figure 3:
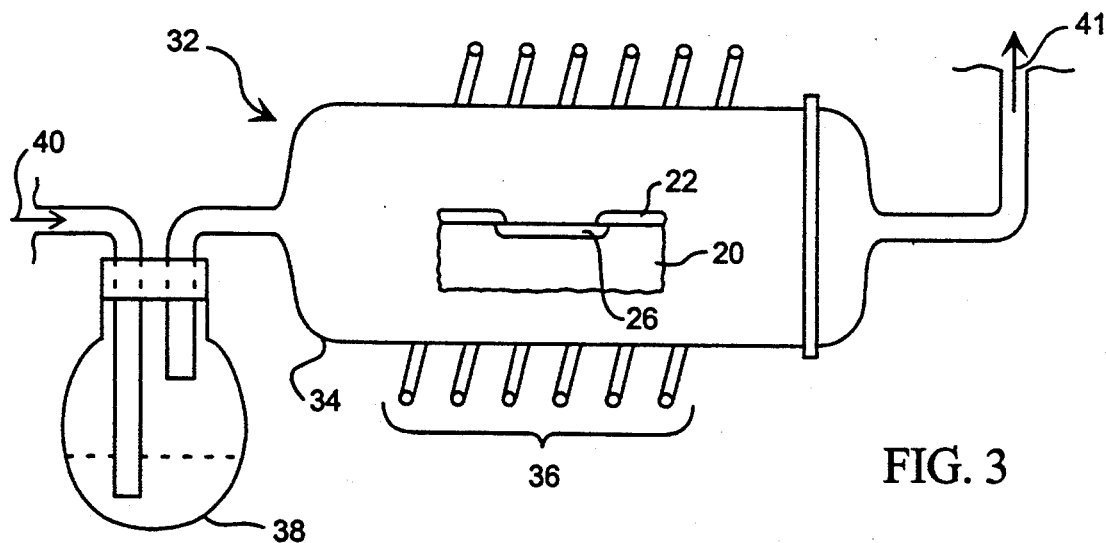
FIG. 3 is a partial cross-section view of a substrate placed within a diffusion tube to form a diffusion junction according to the present invention.

Referring now to FIG. 3, junction 26 is shown placed within substrate 20 by a diffusion furnace 32. Furnace 32 comprises a fused silica tube 34 surrounded by heater elements or coils 36. To achieve diffusion of atoms or molecules in a material, solid, liquid or gas dopant are introduced into a junction area 26 which is heated by coils 36 to a temperature in the range of 900° C. to 1300° C. Recent trends being the lowering of temperature in order to achieve shallower junction. The source of impurities can be gaseous such as phosphene, arsine, or diborane which are introduced into tube 34 as a gas stream. Alternatively, liquid sources can be used as shown in FIG. 3. The liquid source is maintained at a fixed temperature within a container 38, and a carrier gas is bubbled through the container as shown by reference number 40. The resulting vapor is then carried into heated tube 34 where it is then deposited into junction 26 with excess vapor being expelled via exhaust port 41. Generally speaking, wafer diffusion boats containing a plurality of wafers suspended within tube 34 are used to transport the substrate material through the tube. Solid state sources may also be used such as, e.g., boron nitride disk heated in a stream of oxygen in proximity to the substrate in order to develop boron dopant on the substrate. Other solid sources and resultant dopants can be used.

Figure 4:
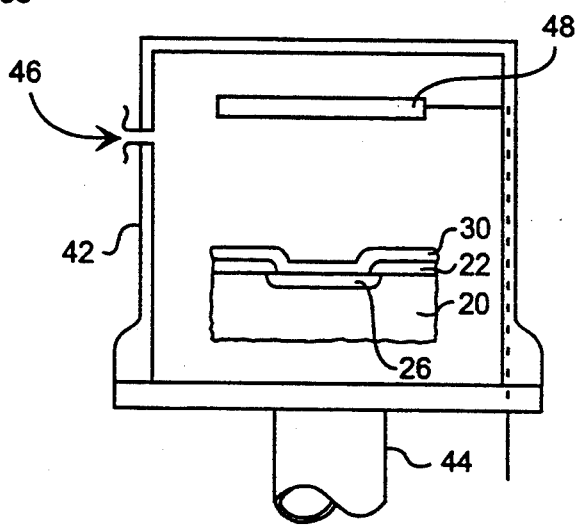
FIG. 4 is a partial cross-section view of a substrate placed within a sputter chamber to deposit a barrier layer according to the present invention.

After junction 26 is formed, a thin layer of inorganic film such as that comprising barrier 30 is deposited across the surface topography as shown in FIG. 4. Barrier 30 is placed in contact with the upper surface of junction 26 and oxide 22 thereby making physical contact with junction 26 but not with other silicon areas laterally displaced from the junction and below the oxide. Various techniques can be used to deposit barrier 30 including sputtering. Sputter deposition utilizes a low pressure vacuum chamber 42. Low pressure therefore exists in both the sputter deposition chamber and the diffusion tube 34. It is well known that lower pressure operation prohibits or minimizes fluctuation of contaminants which might enter the respective container. By using low pressure in both the sputter and diffusion containers, relatively few contaminants are allowed to enter junction 26 and barrier 30 during processing. A series of vacuum pumps (not shown) are attached to port 44 to achieve a final process vacuum base pressure ranging from $10^{-9}$ to $10^{-7}$ torr.

Barrier 30 is deposited preferably in an argon atmosphere entering the chamber via opening 46. Charged ions from the argon plasma are accelerated toward target 48 thereby ejecting (sputtering) molecules from the target. Target 48 comprises a hot pressed alloy of anywhere from 10% to 30% (atomic) titanium and 90% to 70% (atomic) tungsten, respectively, with a purity exceeding 99.99%. Alternatively, two targets can be used, one having controlled concentrations of tungsten and the other having controlled concentrations of titanium. The ejected molecules deposit as a film across the monolithic circuit using an RF power source connected to target 46. Powering the source at approximately 500 watts while maintaining sputter pressure of approximately $1 \times 10^{-3}$ torr may achieve a deposition rate between 55 and 65 Å/min. The deposition rate being fairly small allows the operator to closely monitor and cease deposition once barrier thickness reaches a predetermined amount.

Preferably, barrier thickness need not exceed 500 Å in order to prevent the migration of atomic species between the top conductor and the substrate. A thin barrier presents less resistance to the passage of charge carriers and allows a denser circuit topography which is advantageous to VLSI design. A thin barrier overlying the edge of oxide 22 will also ensure a better step coverage of subsequent conductor layer 28. It is important when processing the barrier that the barrier remain as thin as possible while retaining barrier integrity before, during and after high temperature anneal. Therefore, anneal (nitridation and silicidation) must be carefully performed in thin barrier layers according to the process described herein.

Figure 5:
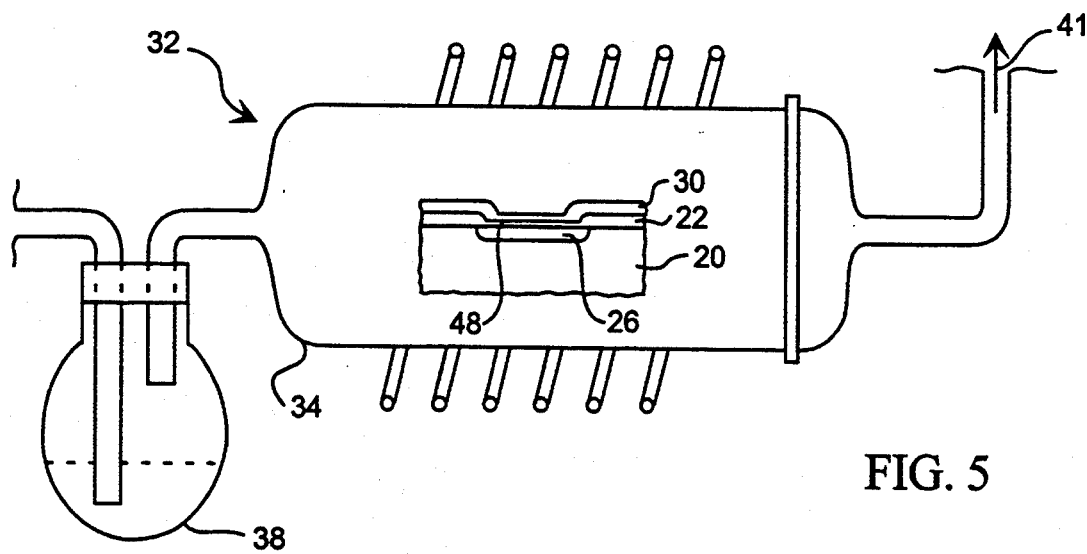
FIG. 5 is a partial cross-section view of a substrate placed within a diffusion tube to form nitride at the upper surface of the barrier layer according to the present invention.

Referring to FIG. 5, substrate 20 can be re-inserted into diffusion furnace 32 after barrier is deposited. Ammonia vapor is carried into furnace 32 from container 38 where nitrogen, and other impurities such as hydrogen and oxygen, are deposited upon the upper surface of barrier 30. Nitrogen, being highly mobile, diffuses deeply into barrier 30. Simultaneous or occurring at approximately the same time as nitridation of barrier 30, the lower surface of barrier 30 (that surface which contacts junction 26) forms a silicide ($TiSi_x$ and/or $WSi_y$) as indicated by reference numeral 48. Note that the concentrations of Si can vary in relation to the concentration of Ti and/or W, and that the concentration values of x and y can be equal to or dissimilar from each other. Further, it is important that x and y need not be whole numbers (such as two), or that $TiSi_x$ and $WSi_y$ need not be disilicides. A silicide is nonetheless formed with any concentration of x and y found within the compound thus formed. Ammonia vapor is exited via port 41 as shown. Prior to the introduction of ammonia, nitrogen can be input into tube 34 at a flow rate of approximately 8 slpm during time in which heater coils 36 are at approximately 600° C. Introduction of nitrogen can be repeated over several cycles at higher temperatures if desired to achieve more nitridation of the upper barrier surface. Alternatively, or in addition to the introduction of nitrogen, ammonia can be introduced at a flow rate of approximately 120 sccm with the furnace heated to approximately 600° C. Nitridation using either ammonia and nitrogen gas, or only ammonia, is achieved with tube 34 placed at a pressure within the range of $5 \times 10^{-3}$ torr to $800 \times 10^{-3}$ torr for nitrogen and $1 \times 10^{-3}$ torr to $800 \times 10^{-3}$ torr for ammonia.

Figure 6:
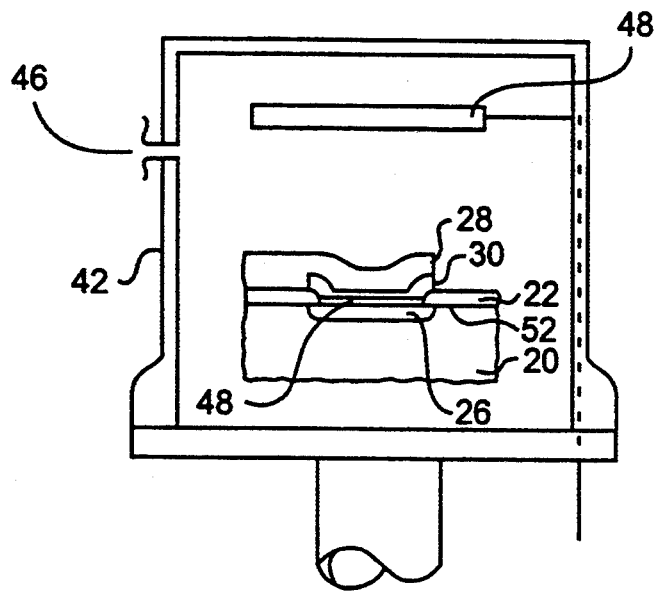
FIG. 6 is a partial cross-section view of a substrate placed within a sputter chamber to deposit an overlying conductive layer according to the present invention.

Referring now to FIG. 6, a final metallization layer comprising conductor 28 can be deposited across the upper surface of barrier 30 and oxide 22. Deposition is preferably achieved using sputter chamber 32 previous described and used for the deposit of barrier 30. However, instead of target 48 being tungsten and titanium alloy, target 48 used to deposit conductor 28 can be made of any highly conductive material including aluminum or a combination of aluminum and silicon. Aluminum exhibits good adherence to the upper barrier surface as well as silicon dioxide 22. Subsequent patterning and etch of aluminum achieves final multi-layered metallization product having aluminum (or aluminum and silicon) layered with nitride, titanium, tungsten and silicide. Various other impurities such as hydrogen and oxygen can be placed within the barrier to form additional layered regions. Thus, metallization includes many layers, each layer performing a necessary function in providing good ohmic contact and adherence to active region 24 as well as highly conductive routing between active regions. Moreover, numerous layers are needed to ensure that destructive diffusion of silicon and aluminum is minimized while allowing charge carrier diffusion therebetween.

It is appreciated from the drawings and metallization process described herein that diffusion furnace 32 can be utilized for both the implantation of impurities into silicon 20 as well as nitridation and silicidation of overlying barrier. Diffusion furnace 32 provides low temperature, low pressure advantages necessary to achieve thin barriers having a final nitride and silicide regions separated from each other within the thin barrier.

Figure 7:
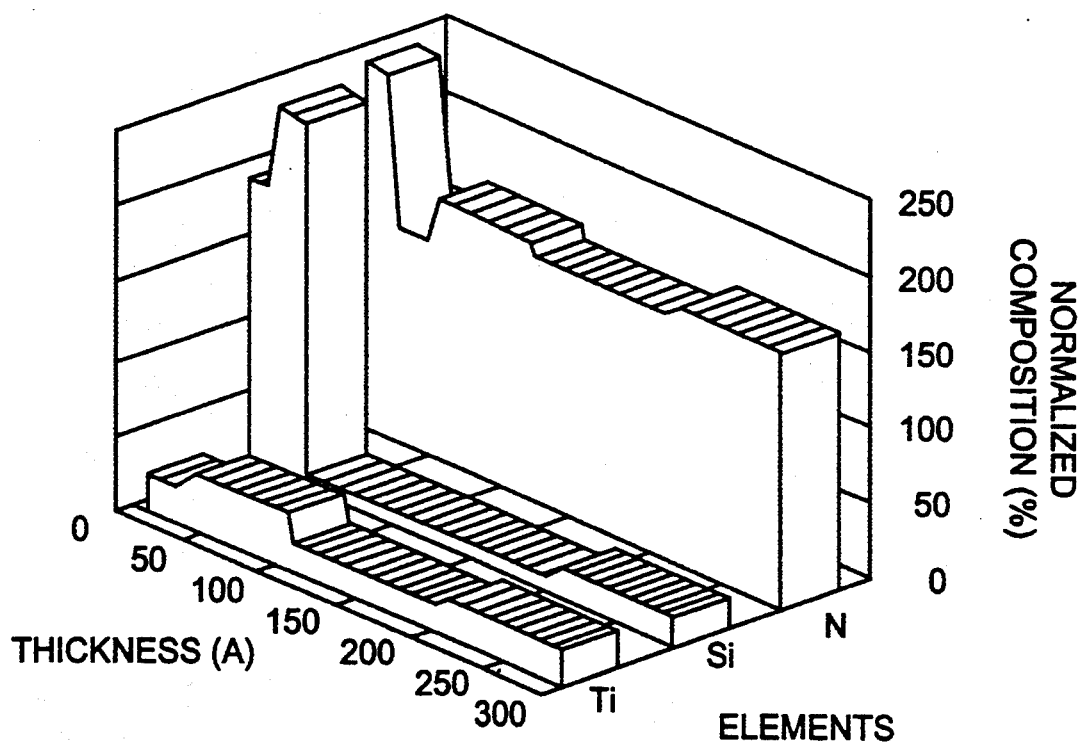
FIG. 7 is a graph illustrating varying amounts of chemical elements found within the barrier at varying depths according to the present invention.

Referring now to FIG. 7, a graph is shown of varying amounts of chemical elements found within barrier 30 of the present invention. The barrier is illustrated in FIG. 7 having a 300 Å thickness, whereby 0 Å corresponds to an initial lower barrier surface adjacent junction 26 (or corresponds to a slice substantially coplanar to the demarcation line 52, shown in FIG. 6, between substrate 20 and silicon dioxide 22). Extending vertically above the 0 Å slice to a 300 Å slice (possibly at or near the upper surface of barrier 30), various composition of titanium, silicon and nitride are shown. Specifically, each composition is normalized to tungsten (tungsten being at 100%). Titanium is shown ranging between approximately 10% to 30% that of tungsten across the barrier thickness. As expected, silicidation at the barrier/junction interface is indicated by a large atomic percent of silicon to a thickness of approximately 50 Å within barrier 30. Contrary to silicon, nitrogen placed into the diffusion appears highly mobile and diffuses substantially throughout the barrier thickness. Other impurities such as hydrogen and oxygen may also appear throughout barrier and at different percentage compositions depending upon barrier thickness. The impurities help pack interstitial sites of the barrier grain boundaries to possibly help limit the cross diffusion of silicon and aluminum.

It will be appreciated to those skilled in the art having the benefit of this disclosure that this invention is believed to be capable of applications with numerous types of substrates, either silicon or, gallium arsenide, either p-type or n-type. Furthermore, various types of metallization and conductive materials used therein can be used provided the metallization is multi-layered and has a diffusion barrier placed between the upper conductor and underlying junction. It is to be understood that the form of the invention shown and described is to be taken as a presently preferred, exemplary embodiment. Various modifications and changes may be made without departing from the spirit and scope of the invention as set forth in the claims. An exemplary modification might be one which uses varying types of deposition and implant techniques or devices to achieve the same result, namely, low temperature, low pressure deposition and implant with simultaneous or near simultaneous nitridation and silicidation in the presence of ammonia. It is intended that the following claims be interpreted to embrace all such modifications and changes.

What is claimed is:

1. A method for depositing an integrated circuit metallization layer comprising the steps of:
   providing a silicon substrate;
   inserting said substrate into a heated diffusion tube;
   introducing a dopant into said diffusion tube and into a select active region of said substrate;
   removing said substrate from said diffusion tube;
   sputter depositing a barrier layer less than 500 angstroms in thickness of titanium and tungsten material simultaneously across the upper surface of said active region, wherein said barrier comprises an upper surface exposed to an environment and a lower surface bonded to said active region;
   re-inserting the substrate into said heated diffusion tube;
   introducing ammonia into said diffusion tube to form nitride within the upper surface of said barrier during the formation of a silicide within the lower surface of said barrier; and
   sputter depositing a conductive layer of aluminum and silicon simultaneously across the upper surface of said barrier.

2. The method as recited in claim 1, wherein said inserting and re-inserting steps each comprise placing the substrate between heating coils which are preheated between 600° C. to 800° C.

3. The method as recited in claim 1, wherein said step of sputter depositing a barrier layer comprises:
   inserting said substrate within a chamber containing a target comprising titanium and tungsten material;
   introducing argon within said chamber;
   forming argon ions within said chamber and directing said ions upon said target;

ejecting molecules of said titanium and tungsten material from said target; and
collecting said ejected molecules upon said substrate.

4. The method as recited in claim 1, wherein said step of sputter depositing aluminum and silicon comprises:
inserting said substrate within a chamber containing a target comprising aluminum and silicon material;
introducing argon within said chamber;
forming argon ions within said chamber and directing said ions upon said target;
ejecting molecules of said aluminum and silicon material from said target; and
collecting said ejected molecules upon said substrate and across the upper surface of said barrier.

5. The method as recited in claim 1, wherein said step of introducing ammonia comprises:
evacuating said diffusion tube to a first pressure level;
introducing nitrogen into said tube at a substantially constant flow rate;
evacuating said diffusion tube to a second pressure level higher than said first pressure level; and
introducing ammonia into said tube at a substantially constant flow rate.

6. The method as recited in claim 5, wherein said first pressure level is less than $5 \times 10^{-3}$ torr.

7. The method as recited in claim 5, wherein said second pressure level is less than one torr.

8. The method as recited in claim 5, wherein said nitrogen flow rate is substantially equal to 8 slpm.

9. The method as recited in claim 5, wherein said ammonia flow rate is substantially equal to 120 sccm.

10. The method as recited in claim 1, wherein said barrier layer comprises a compound having an atomic ratio of titanium and tungsten substantially equal to 1:3.

11. The method as recited in claim 1, wherein said conductive layer comprises a compound having an atomic ratio of aluminum and silicon substantially equal to 99:1.

12. The method as recited in claim 1, wherein said conductive layer comprises a sheet resistance substantially equal to 10 ohms/square.

13. A method for depositing an integrated circuit metallization layer comprising the step of:
providing a silicon substrate;
inserting said substrate into a diffusion tube having a heating coil pre-heated to a temperature between 600° C. to 800° C.;
introducing a dopant into said diffusion tube and into a select active region of said substrate;
removing said substrate from said diffusion tube;
inserting said substrate within a sputter chamber containing a target having an atomic ratio of titanium and tungsten substantially equal to 1:3;
introducing argon within said chamber;
forming argon ions within said sputter chamber and directing said ions upon said target;
ejecting molecules of said titanium and tungsten material from said target;
collecting said ejected titanium and tungsten molecules upon said substrate to form a barrier layer less than 500 angstroms in thickness, wherein said barrier comprises an upper surface exposed to an environment and a lower surface bonded to said active region;
re-inserting the substrate into said diffusion tube having said heating coil pre-heated to a temperature between 600° C. to 800° C.;
evacuating said diffusion tube to a first pressure level;
introducing nitrogen into said tube at a substantially constant flow rate;
evacuating said diffusion tube to a second pressure level higher than said first pressure level;
introducing ammonia into said tube at a substantially constant flow rate to form nitride within the upper surface of said barrier simultaneous with the formation of a silicide within the lower surface of said barrier, whereby said nitride upper surface and said silicide lower surface are configured within said barrier and spaced substantially parallel from each other; and
inserting said substrate within said sputter chamber containing a target having an atomic ratio of aluminum and silicon substantially equal to 99:1;
introducing argon within said chamber;
forming argon ions within said sputter chamber and directing said ions upon said target;
ejecting molecules of said aluminum and silicon from said target; and
collecting said ejected aluminum and silicon molecules upon said substrate to form a conductive layer having a sheet resistance substantially equal to 10 ohms/square.

* * * * *